US007002377B2

(12) United States Patent  
Mori

(10) Patent No.: US 7,002,377 B2  
(45) Date of Patent: Feb. 21, 2006

(54) CLOCK SIGNAL DETECTION CIRCUIT AND SEMICONDUCTOR INTEGRATED CIRCUIT USING THE SAME

(75) Inventor: Masaru Mori, Hino (JP)

(73) Assignee: Seiko Epson Corporation, (JP)

( * ) Notice: Subject to any disclaimer, the term of this patent is extended or adjusted under 35 U.S.C. 154(b) by 0 days.

(21) Appl. No.: 10/829,100

(22) Filed: Apr. 21, 2004

(65) Prior Publication Data

US 2004/0257122 A1 Dec. 23, 2004

(30) Foreign Application Priority Data

Apr. 21, 2003 (JP) .............................. 2003-115248

(51) Int. Cl.
*H03K 5/19* (2006.01)
(52) U.S. Cl. .......................... 327/18; 327/20; 327/108; 326/82
(58) Field of Classification Search ............ 327/18–21, 327/108–112, 292
See application file for complete search history.

(56) References Cited

U.S. PATENT DOCUMENTS

| 4,620,310 | A | * | 10/1986 | Lvovsky et al. ............ 375/288 |
| 5,453,719 | A | * | 9/1995 | Narahara ..................... 331/49 |
| 5,557,223 | A | * | 9/1996 | Kuo ............................ 327/108 |
| 5,619,511 | A | * | 4/1997 | Sugisawa et al. ........... 714/726 |
| 5,999,022 | A | * | 12/1999 | Iwata et al. ................. 327/112 |
| 6,044,027 | A | * | 3/2000 | Zheng et al. ............... 365/194 |
| 6,087,886 | A | * | 7/2000 | Ko ............................. 327/408 |
| 6,222,585 | B1 | | 4/2001 | Endoh ......................... 348/294 |
| 6,262,616 | B1 | * | 7/2001 | Srinivasan et al. ......... 327/264 |
| 6,879,200 | B1 | * | 4/2005 | Komura et al. ............. 327/278 |

FOREIGN PATENT DOCUMENTS

JP          10-123996          5/1998

* cited by examiner

*Primary Examiner*—Timothy P. Callahan  
*Assistant Examiner*—An T. Luu  
(74) *Attorney, Agent, or Firm*—Harness, Dickey & Pierce, P.L.C.

(57) ABSTRACT

A clock signal detection circuit is provided that can reliably detect whether or not a clock signal is supplied with a reduced circuit scale and reduced power consumption. The clock signal detection circuit comprises: a tristate buffer circuit that generates an output signal of predetermined potential when a clock signal is in a first level, and that sets the output terminal to the high impedance state when the clock signal is in a second level; a resistor disposed between the output terminal of the tristate buffer circuit and a different potential from the predetermined potential; and a buffer circuit that generates a clock signal detection result in accordance with the output potential of the tristate buffer circuit,

8 Claims, 3 Drawing Sheets

CLOCK SIGNAL DETECTION CIRCUIT AND SEMICONDUCTOR INTEGRATED CIRCUIT USING THE SAME

RELATED APPLICATIONS

The present application claims priority to Japanese Patent Application No, 2003-115248 filed Apr. 21, 2003 which is hereby expressly incorporated by reference herein in its entirety.

BACKGROUND

1. Field of the Invention

The present invention relates to a clock signal detection circuit that detects whether or not a clock signal is supplied thereto and further to a semiconductor integrated circuit using such a clock signal detection circuit, 2. Description of the Related Art Semiconductor integrated circuits for handling digital signals commonly contain many circuits that operates in sync with a clock signal, such as a flip-flop circuit. In order to detect whether or not the clock signal is supplied to such a circuit, clock detection circuits are sometimes used in such semiconductor integrated circuits, Conventional clock signal detection circuits sample a target clock signal based on a reference clock signal to detect whether or not a level of the target clock signal changes, However, this is problematic in that a large-scale circuit is necessary to perform such detection causing large power consumption, Moreover, the reliability of detection is not very high, Incidentally, in Japanese unexamined patent publication No, 10-123996 (Pages 1 and 5, FIG. 1), a bolometer-type infrared ray sensor is described as an example of a semiconductor device equipped with a pixel protection circuit. This bolometer-type infrared ray sensor consistently watches a plurality of data signals and clock signals input thereto by respective monitoring circuit, thus preventing the pixel from being selected by turning off a switch if a scanning circuit stops or operates improperly because of, for example, disconnection of these signals, In the bolometer-type infrared ray sensor, a horizontal clock monitoring circuit comprises a retriggerable monostable multivibrator. The horizontal clock monitoring circuit outputs a signal for enabling a horizontal switch to select pixels if a horizontal clock signal is continuously input, but if the horizontal clock stops, the horizontal clock monitoring circuit outputs a signal for making the horizontal switch move to a shut-down state after a time constant determined by a capacitor and a resistor has elapsed, thus protecting the device by preventing pixels from being deteriorated in quality or broken, Here, the time constant determined by the capacitor and resistor is selected to a time duration throughout which any specific one of the pixels can be continuously selected without any deterioration in quality or breaking-down of the pixel caused by self-heating of a bolometer. However, monostable multivibrators have a large circuit scale and accordingly require large power consumption, Furthermore, if a capacitor is formed inside a semiconductor integrated circuit, a particularly large area is necessary among passive elements because the capacitor has a structure of two parallel electrodes holding a dielectric material therebetween.

Consequently, taking the above into consideration, the present invention advantageously provides a clock signal detection circuit and a semiconductor integrated circuit using the same clock signal detection circuit that is able to reliably detect whether or not a clock signal is supplied thereto with a reduced circuit scale and reduced power consumption.

SUMMARY

In order to solve the above problems, a clock signal detection circuit according to a first aspect of the present invention comprises: a first circuit for generating an output signal of predetermined potential in accordance with a first level of a clock signal, and for setting an output terminal to the high impedance state in accordance with a second level of the clock signal; an impedance element disposed between the output terminal of the first circuit and a potential different from the predetermined potential; and a second circuit for generating a clock signal detection result in accordance with the output potential of the first circuit.

A clock signal detection circuit according to a second aspect of the present invention comprises: a first circuit for generating an output signal of predetermined potential in accordance with a first level of a clock signal, and for setting an output terminal to the high impedance state in accordance with a second level of the clock signal; a first impedance element disposed between the output terminal of the first circuit and a potential different from the predetermined potential; a second circuit for generating an output signal in accordance with the output potential of the first circuit; a third circuit for generating an output signal of the predetermined potential in accordance with a second level of a clock signal, and for setting an output terminal to the high impedance state in accordance with a first level of the clock signal; a second impedance element disposed between the output terminal of the third circuit and a potential different from the predetermined potential; a fourth circuit for generating an output signal in accordance with the output potential of the third circuit; and a fifth circuit for generating a clock signal detection result based on the output signals of the second and the fourth circuit.

In the above circuits, the impedance elements can include a resistor or a capacitor.

Furthermore, a semiconductor integrated circuit according to a first aspect of the present invention comprises: a first circuit for generating an output signal of a predetermined potential in accordance with a first level of a clock signal, and for setting an output terminal to the high impedance state in accordance with a second level of the clock signal; and a second circuit for generating a clock signal detection result in accordance with the output potential of the first circuit with an impedance element disposed between the output terminal of the first circuit and potential different from the predetermined potential.

A semiconductor integrated circuit according to a second aspect of the present invention comprises: a first circuit for generating an output signal of a predetermined potential in accordance with a first level of a clock signal, and for setting an output terminal to the high impedance state in accordance with a second level of the clock signal; a second circuit for generating an output signal in accordance with the output potential of the first circuit with a first impedance element disposed between the output terminal of the first circuit and potential different from the predetermined potential; a third circuit for generating an output signal of the predetermined potential in accordance with a second level of a clock signal, and for setting an output terminal to the high impedance state in accordance with a first level of the clock signal; a fourth circuit for generating an output signal in accordance with the output potential of the third circuit with a second impedance element disposed between the output terminal of the third circuit and potential different from the predetermined potential; and a fifth circuit for generating a clock signal detection result based on the output signals of the second and the fourth circuit.

In the above circuits, each of the first and the second impedance elements can be arranged to include one of an external resistor, and a resistor and a transistor formed inside the semiconductor integrated circuit.

According to the present invention, the output signal of the first circuit that generates the output signal of predetermined potential in accordance with a first level of a clock signal, and sets an output terminal to the high impedance state in accordance with a second level of the clock signal is smoothed, and then used to detect the clock signal. Thus, it is possible to reliably detect whether or not the clock signal is supplied with a reduced circuit scale and with reduced power consumption.

DETAILED DESCRIPTION

Hereinafter, preferred embodiments of the present invention will be described referring to the accompanying drawings.

Figure 1:
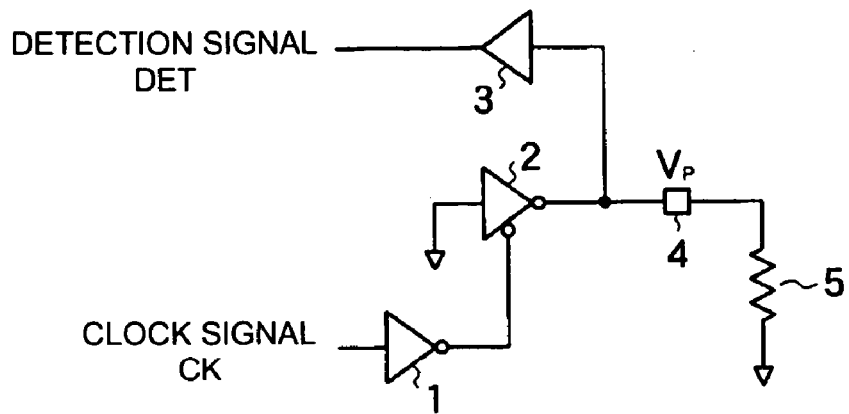
FIG. 1 is a view showing a clock signal detection circuit according to a first embodiment of the present invention.

FIG. 1 is a view showing a configuration of a clock signal detection circuit according to a first embodiment of the present invention, As shown in FIG. 1, this clock signal detection circuit includes (inside the semiconductor integrated circuit) an inverter 1 for inverting a clock signal CK, tristate buffer circuit 2 having an output enable terminal to which the clock signal inverted by the inverter 1 is supplied, and a buffer circuit 3 to which an output signal of the tristate buffer circuit 2 is input. The output signal from the tristate buffer circuit 2 is also supplied to a terminal (a pad) 4 of the semiconductor integrated circuit. An external resistor, as an impedance element, is disposed between the pad 4 and the earth potential (ground).

Figure 2:
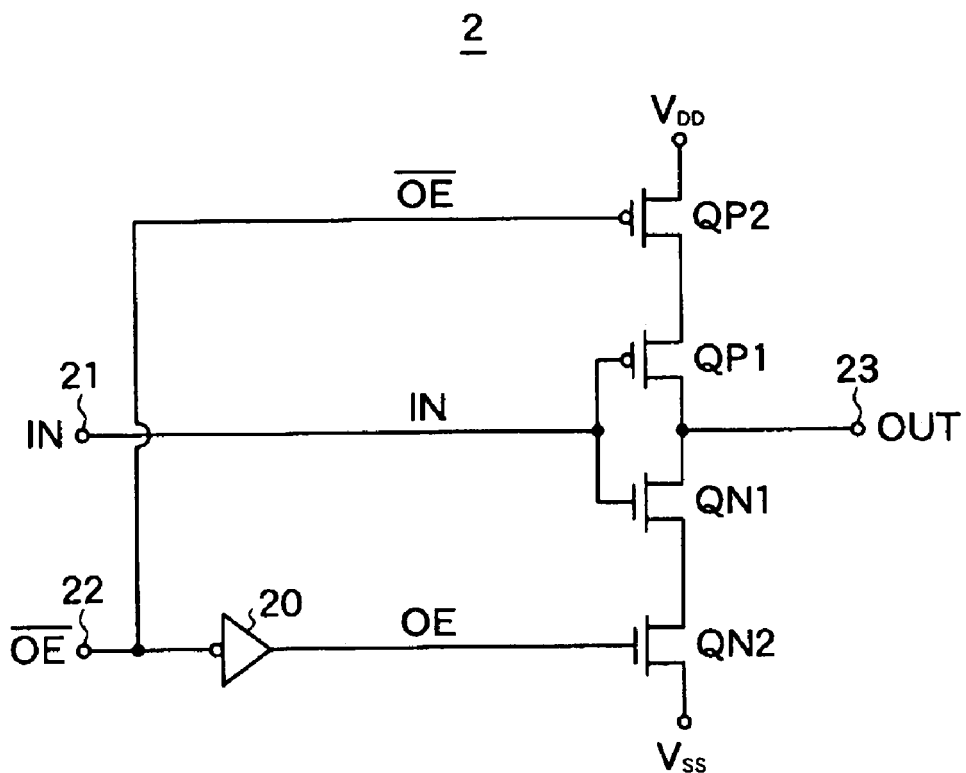
FIG. 2 is a circuit diagram showing a configuration of the tristate buffer circuit shown in FIG. 1.

FIG. 2 is a circuit diagram showing a configuration of the tristate buffer circuit shown in FIG. 1. As shown in FIG. 2, tristate buffer circuit 2 is provided with a P channel MOS transistor QP1 and a N channel MOS transistor QN1 that form an inverter, a P channel MOS transistor QP2 and a N channel MOS transistor QN2 for respectively supplying source current to transistors QP1 and QN1, and an inverter 20 for inverting an output enable signal OE bar of the negative-true logic to output an output enable signal OE.

The transistor QP2 is disposed between the higher power source potential $V_{DD}$ and performs switching in accordance with the output enable signal OE bar of the negative-true logic applied to an output enable terminal 22. In contrast, the transistor QN2 is disposed between the transistor QN1 and the lower power source potential $V_{SS}$ (assumed to be the earth potential in the present embodiment) and performs switching in accordance with the output enable signal OE output from the inverter 20.

When the output enable signal OE bar of the negative-true logic is in the low level, the transistors QP2 and QN2 turn on to cause the transistors QP1 and QN1 to operate as an inverter that inverts input signal IN applied to an input terminal 21 and output the inverted signal from an output terminal 23 as an output signal OUT.

In contrast, when the output enable signal OE bar of the negative-true logic is in the high level, the transistors QP2 and QN2 turn off to cause the transistors QP1 and QN1 to turn off resulting in the high-impedance state of the output terminal 23 independent of the state of the input signal IN applied to the input terminal 21.

Referring to FIG. 1 again, the earth potential is supplied to the input terminal of the tristate buffer circuit 2 for providing thereto a low level input signal. The tristate buffer circuit 2 inverts the low level input signal to generate the high level output signal when the clock signal CK is in the high level, and makes the output terminal be in the high impedance when the clock signal is in the low level.

The resistor 5 is disposed between the pad 4 and the earth potential. In general, an equivalent circuit of a resistor includes a resistance component and a capacitance component connected in parallel to the resistance component, Further, the tristate buffer circuit 2 has output capacitance, and the buffer circuit has input capacitance, Furthermore, there is stray capacitance in interconnection wiring. Accordingly, there is also provided a capacitance component in addition to the resistance component between the pad 4 and the earth potential.

Electric potential of the pad 4 (hereinafter referred to as pad potential) $V_p$ is integrated (smoothed) by the resistance component and the capacitance component mentioned above when the output terminal of the tristate buffer circuit 2 is in the high impedance state. The buffer circuit 3 outputs a detection signal DET in accordance with the output level of the tristate buffer circuit 2, namely the pad potential $V_P$.

Figure 3:
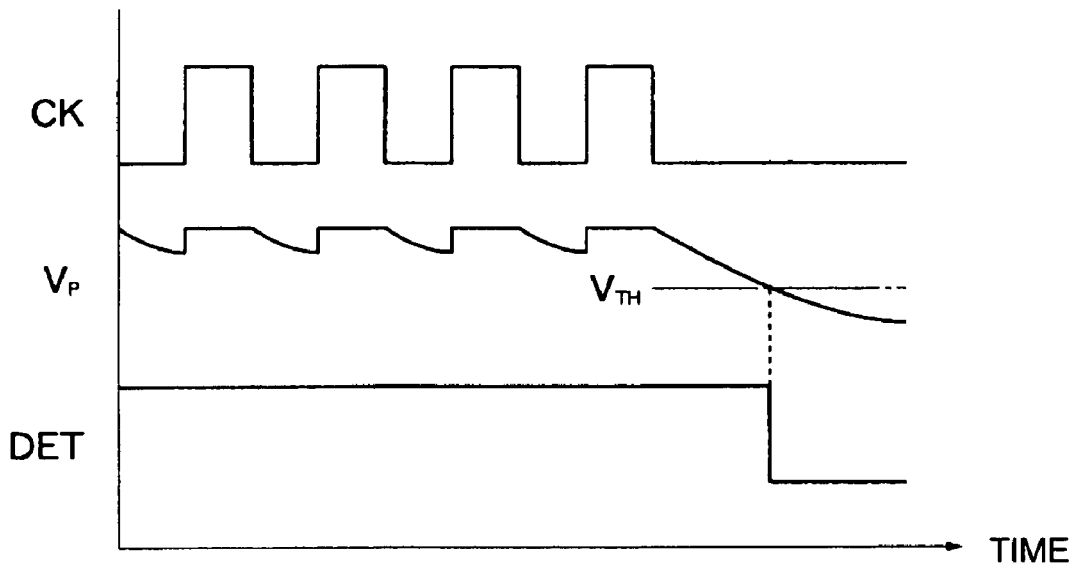
FIG. 3 is a waveform chart showing waveforms at various points in the circuit shown in FIG. 1.

FIG. 3 is a waveform chart showing waveforms at various points in the circuit shown in FIG. 1. While the clock signal CK is supplied, the high level of the clock signal CK causes the high level in the pad potential $V_P$ because the output signal of the tristate buffer circuit 2 is supplied thereto, and during the clock signal CK is in the low level, the pad potential $V_P$ smoothly drops by a discharge through the resistor 5.

In contrast, when the clock signal CK is held to the low level, the output terminal of the tristate buffer circuit 2 is held in the high impedance state causing the pad potential $V_p$ to approach the earth potential by discharging through the resistor 5. Assuming that an input level that causes the output level of the buffer circuit 3 to be changed to the other level is a threshold level $V_{TH}$, the detection signal DET is in the high level while the pad potential $V_P$ is higher than the threshold level $V_{TH}$, but when the pad potential $V_P$ goes below the threshold level $V_{TH}$, the detection signal DET also goes to the low level. Thus, it is possible to reliably detect whether or not the clock signal CK is supplied with a simple circuit configuration.

Next, a second embodiment of the present invention will be described.

Figure 4:
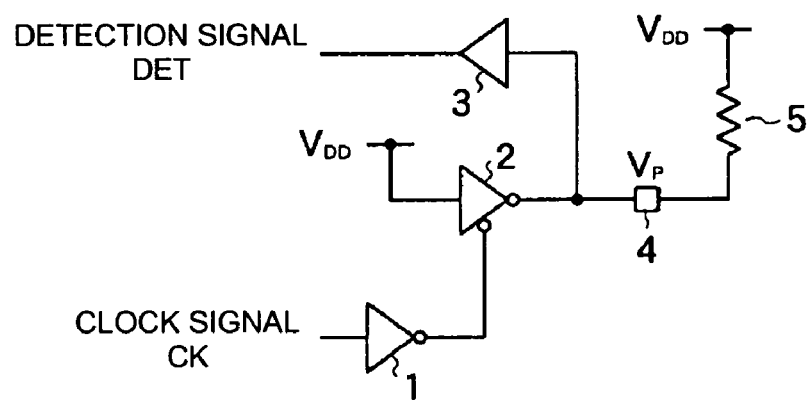
FIG. 4 is a view showing a clock signal detection circuit according to a second embodiment of the present invention.

FIG. 4 is a view showing a configuration of a clock detection circuit according to the second embodiment of the present invention. In the present embodiment, the higher power source potential $V_{DD}$ is supplied to the input terminal of the tristate buffer circuit 2, and the resistor 5 is disposed between the pad 4 and the power source potential $V_{DD}$. The other portion of the configuration not mentioned here is substantially the same as in the first embodiment.

The tristate buffer circuit 2 inverts the high level of the input signal to generate the low level output signal when the clock signal CK is in the high level, and when the clock signal CK is in the low level, the tristate buffer circuit 2 changes a state of its output terminal to the high impedance state. While the clock signal CK is supplied, the high level of the clock signal CK causes the low level of the pad potential $V_P$ because the output potential of the tristate buffer circuit 2 is applied thereto, and during the time the clock signal CK is held in the low level, the pad potential $V_P$ smoothly increases by charging through the resistor 5.

In contrast, when the supply of the clock signal CK stops, the pad potential $V_P$ approaches the power source potential $V_{DD}$ by charging through the resistor 5. While the pad potential $V_P$ is below the threshold level $V_{TH}$, the detection signal DET remains in the low level, but when the pad potential $V_P$ exceeds the threshold level $V_{TH}$, the detection signal DET is switched to the high level. Thus, with a simple circuit configuration, it is possible to reliably detect whether or not the clock signal CK is supplied thereto.

In the above embodiments, the resistor 5 is provided externally. However, the resistor 5 can be formed inside the semiconductor integrated circuit. Alternatively, a transistor can also be used instead of the resistor.

Next, a third embodiment of the present invention that uses a transistor as the impedance element will be described.

Figure 5:
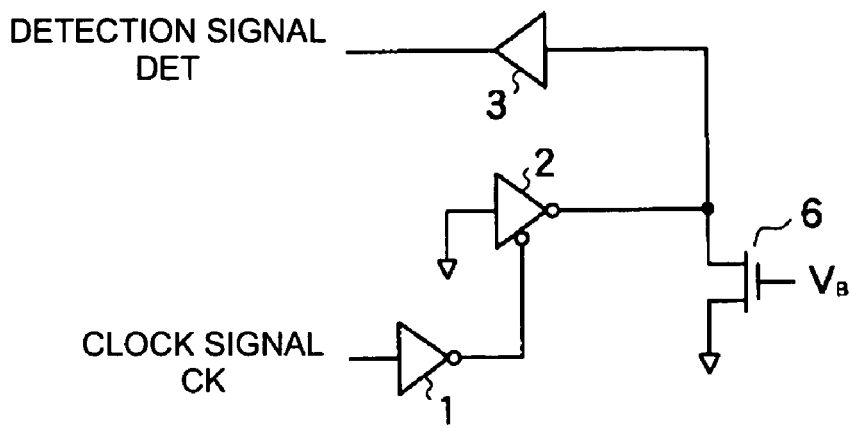
FIG. 5 is a view showing a clock signal detection circuit according to a third embodiment of the present invention.

FIG. 5 is a view showing a configuration of a clock signal detection circuit according to the third embodiment of the present invention. As shown in FIG. 5, an N channel MOS transistor 6 is disposed between the output terminal of the tristate buffer circuit 2 and the earth potential. Since the gate of the transistor 6 is provided with a predetermined bias voltage $V_B$, electric current corresponding to the bias voltage $V_B$ flows in the transistor 6, which is equivalent to the resistor.

In general, transistors have capacitance components between the drain and the gate, and between the gate and the source. Furthermore, the tristate buffer circuit 2 has the output capacitance, and the buffer circuit 3 has the input capacitance. In addition, there is the stray capacitance around the interconnection wiring. Accordingly, the resistance component and the capacitance component are disposed between the output terminal of the tristate buffer circuit 2 and the earth potential.

When the output terminal of the tristate buffer circuit 2 is in the high impedance state, the output potential thereof is integrated (smoothed) by the resistance component and the capacitance component mentioned above. The buffer circuit 3 outputs the detection signal DET in accordance with the output potential of the tristate buffer circuit 2. Regarding the overall operation, description for the first embodiment can substantially be applied to the present embodiment. According to the present embodiment, the clock signal detection circuit can be realized without using the resistor 5, a passive element (See FIG. 1.).

Next, a fourth embodiment of the present invention will be described.

Figure 6:
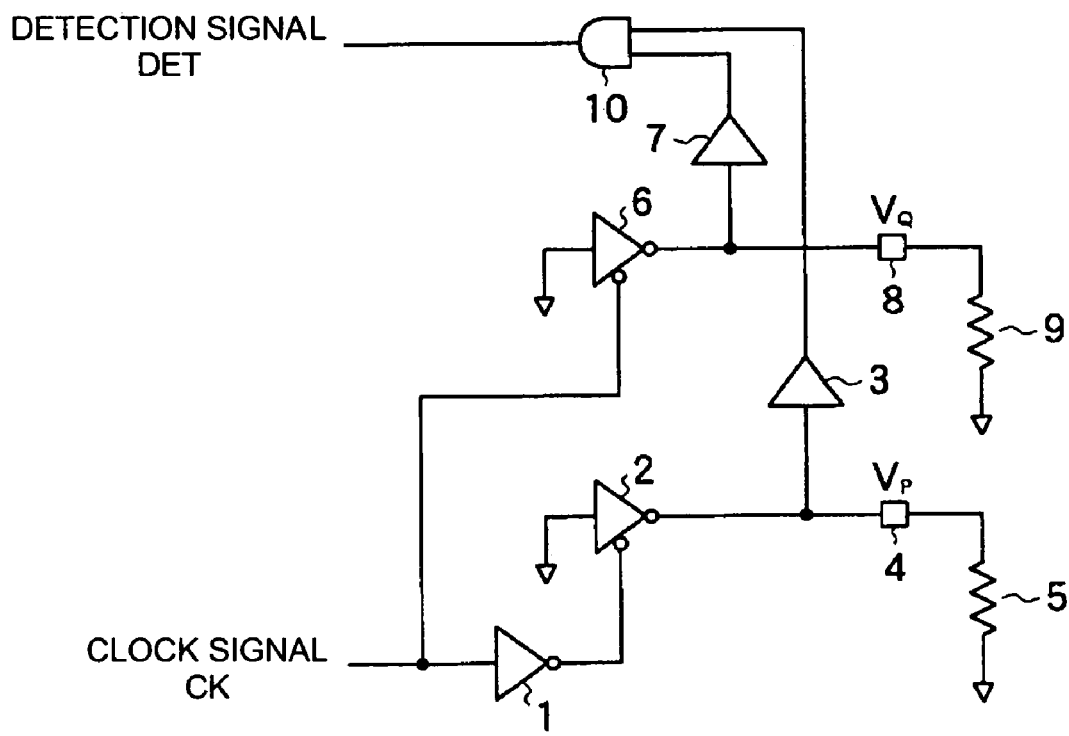
FIG. 6 is a view showing a clock signal detection circuit according to a fourth embodiment of the present invention.

FIG. 6 is a view showing a configuration of a clock signal detection circuit according to the fourth embodiment of the present invention. As shown in FIG. 6, this clock signal detection circuit, in addition to the circuit of the first embodiment shown in FIG. 1, includes (inside the semiconductor integrated circuit) a tristate buffer circuit 6 whose output enable terminal is provided with the clock signal CK, a buffer circuit 7 to which the output signal of the tristate buffer circuit 6 is input, and an AND circuit 10 to which the output signals of the buffer circuits 3 and 7 are input. The output signal of the tristate buffer circuit 6 is also supplied to a pad 8 of the semiconductor integrated circuit. An external resistor 9 as an impedance element is disposed between the pad 8 and the earth potential.

The earth potential is supplied to the input terminal of the tristate buffer circuit 6 to provide the input terminal with the low level input signal. The tristate buffer circuit 6 inverts the low level of the input signal to generate the high level signal as an output signal when the clock signal CK is in the low level, and when the clock signal is in the high level, the tristate buffer circuit 6 sets the output terminal to the high impedance state In addition to a resistance component of the resistor 9, various capacitance components are provided between the pad 8 and the earth potential such as a capacitance component of the resistor 9, an output capacitance of the tristate buffer circuit 6, an input capacitance of the buffer circuit 7, and stray capacitance along the interconnection wiring. Electric potential of the pad 8 (hereinafter referred to as pad potential) $V_Q$ is integrated (smoothed) by the resistance components and the capacitance component mentioned above when the output terminal of the tristate buffer circuit 6 is in the high impedance state. The buffer circuit 7 generates an output signal in accordance with the output potential of the tristate buffer circuit 6, namely the pad potential $V_Q$.

While the clock signal CK is supplied, the low level of the clock signal CK causes the high level of the pad potential $V_Q$ because the output potential of the tristate buffer circuit 6 is applied thereto, and during the time the clock signal CK is held in the high level, the pad potential $V_Q$ smoothly decreases by discharging through the resistor 9.

In contrast, when the clock signal CK stops in the high level, the output terminal of the tristate buffer circuit 6 is set to the high impedance state causing the pad potential $V_Q$ to approach the earth potential by discharging through the resistor 9. Assuming that an input level that causes the output level of the buffer circuit 7 to be changed to the other level is a threshold level $V_{TH7}$, the output potential of the buffer circuit 7 is the high level while the pad potential $V_Q$ is higher than the threshold level $V_{TH7}$, but when the pad potential $V_Q$ goes below the threshold level $V_{TH7}$, the output potential of the buffer circuit 7 also goes to the low level.

Also, the buffer circuit 3 generates an output signal in accordance with the output potential of the tristate buffer circuit 2, namely the pad potential $V_P$. When the clock signal CK stops in the low level, the output terminal of the tristate buffer circuit 2 is set to the high impedance state causing the pad potential $V_P$ to approach the earth potential by discharging through the resistor 5. Assuming that an input level that causes the output level of the buffer circuit 3 to be changed to the other level is a threshold level $V_{TH3}$, the output potential of the buffer circuit 3 is the high level while the pad potential $V_P$ is higher than the threshold level $V_{TH3}$, but when the pad potential $V_P$ goes below the threshold level $V_{TH3}$, the output potential of the buffer circuit 3 also goes to the low level.

Since the output signals of the buffer circuit 3 and 7 are input to the AND circuit 10, when the clock signal CK stops in either the high level or the low level, either one of the output signals of the buffer circuits 3 and 7 becomes the low level, and accordingly, the detection signal DET output from the AND circuit 10 becomes the low level. In this manner, according to the present embodiment, even if the clock signal CK stops in either the high level or low level, it is possible to detect that supply of the clock signal CK stops. Note that in the present embodiment a resistor formed inside the semiconductor integrated circuit or an impedance element such as transistor can also be used instead of the resistor 5 and/or 9.

What is claimed is:

1. A clock signal detection circuit, comprising:
a first circuit generating an output signal of predetermined potential in accordance with a first level of a clock signal, and setting an output terminal to a high impedance state in accordance with a second level of the clock signal;
an impedance element that is disposed between the output terminal of the first circuit and a potential source having a potential that is different from the predetermined potential, and that maintains the output signal above a first threshold when the output terminal is in the high impedance state for less than a first period; and
a second circuit generating a clock signal detection result that is a first state when the output signal is above the first threshold and is a second state when the output signal is below the first threshold,
wherein the output signal decreases below the first threshold when the output terminal is in the high impedance state for greater than or equal to the first period.

2. A clock signal detection circuit, comprising:
a first circuit generating a first output signal of predetermined potential in accordance with a first level of a clock signal, and setting an output terminal of the first circuit to a high impedance state in accordance with a second level of the clock signal;
a first impedance element disposed between the output terminal of the first circuit and a first potential source having a potential that is different from the predetermined potential;
a second circuit generating a second output signal in accordance with an output potential of the first circuit;
a third circuit generating a third output signal with the predetermined potential in accordance with the second level of the clock signal, and setting an output terminal of the third circuit to the high impedance state in accordance with the first level of the clock signal;
a second impedance element disposed between the output terminal of the third circuit and a second potential source having a potential that is different from the predetermined potential;
a fourth circuit generating a fourth output signal in accordance with an output potential of the third circuit; and
a fifth circuit generating a clock signal detection result based on output signals of the second and the fourth circuit.

3. A clock signal detection circuit according to claim 1, wherein the impedance element includes one of a resistor and a transistor.

4. A clock signal detection circuit according to claim 2, wherein at least one of the first and second impedance elements includes one of a resistor and a transistor.

5. A semiconductor integrated circuit, comprising:
a first circuit generating an output signal of a predetermined potential in accordance with a first level of a clock signal, and setting an output terminal to a high impedance state in accordance with a second level of the clock signal; and
a second circuit generating a clock signal detection result that is a first state when the clock signal is at the first level and when the clock signal is at the second level for less than a first period, and that is a second state when the clock signal is at the second level for greater than or equal to the first period, wherein an impedance element disposed between the output terminal of the first circuit and a potential source having a potential that is different from the predetermined potential determines the first period.

6. A semiconductor integrated circuit, comprising:
a first circuit generating a first output signal of a predetermined potential in accordance with a first level of a clock signal, and setting an output terminal of the first circuit to a high impedance state in accordance with a second level of the clock signal;
a second circuit for generating a second output signal in accordance with an output potential of the first circuit with a first impedance element disposed between the output terminal of the first circuit and a first potential source having a potential that is different from the predetermined potential;
a third circuit generating a third output signal of the predetermined potential in accordance with a second level of the clock signal, and setting an output terminal of the third circuit to the high impedance state in accordance with the first level of the clock signal;
a fourth circuit generating a fourth output signal in accordance with an output potential of the third circuit with a second impedance element disposed between the output terminal of the third circuit and a second potential source having a potential that is different from the predetermined potential; and
a fifth circuit generating a clock signal detection result based on output signals of the second and the fourth circuit.

7. A semiconductor integrated circuit according to claim 5, wherein the impedance element includes one of:
an external resistor; and
a resistor and a transistor formed inside the semiconductor integrated circuit.

8. A semiconductor integrated circuit according to claim 6, wherein at least one of the first and second impedance elements includes one of:
an external resistor; and
a resistor and a transistor formed inside the semiconductor integrated circuit.

* * * * *